United States Patent
Blish et al.

(10) Patent No.: US 6,395,568 B1
(45) Date of Patent: May 28, 2002

(54) METHOD AND APPARATUS FOR ACHIEVING BOND PAD CRATER SENSING AND ESD PROTECTION INTEGRATED CIRCUIT PRODUCTS

(75) Inventors: Richard C. Blish, Saratoga; Colin D. Hatchard, Campbell; Ian Morgan, San Jose; Michael Fliesler, Santa Cruz, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 4 days.

(21) Appl. No.: 09/624,665

(22) Filed: Jul. 25, 2000

(51) Int. Cl.[7] .................................................. H01L 21/66
(52) U.S. Cl. ........................................ 438/17; 257/252
(58) Field of Search .............................. 438/14, 17, 18, 438/142; 257/48, 213, 225, 231, 252, 254, 414, 415, 417, 734

(56) References Cited

U.S. PATENT DOCUMENTS 5,751,065 A * 5/1998 Chittipeddi et al. ........ 257/758
5,965,903 A * 10/1999 Chittipeddi et al. .......... 257/48

OTHER PUBLICATIONS

Thin–Film Cracking And Wire Ball Shear In Plastic Dips Due To Temperature Cycle And Thermal Shock, C.G. Shirley and R.C. Blish, 1987 IEEE/IRPS, pp. 238–249.

* cited by examiner

Primary Examiner—Keith Christianson

(57) ABSTRACT

Method for bond pad crater jeopardy identification in integrated circuits, and apparatus which performs the method. The gate or gates of a transistor or transistors of an ESD device are formed under each bond pad in the integrated circuit device. Connected to the transistor is circuitry for determimg the electrical, and hence mechanical, integrity of the transistor. A reduction in current through the transistor, by reason of microcrack formation in the several layers under the transistor causing a gate or gates of the transistor to crack and fail, may detected, Location of at least a portion of the ESD device, for example the above transistor, reduces overall chip area by increasing device density.

9 Claims, 9 Drawing Sheets

METHOD AND APPARATUS FOR ACHIEVING BOND PAD CRATER SENSING AND ESD PROTECTION INTEGRATED CIRCUIT PRODUCTS

BACKGROUND OF THE INVENTION

1. Field of the Invention

The present invention relates to reliability and packaging electronic of devices, particularly integrated circuit devices. More particularly, the present invention relates to a methodology for verifying the reliability of the interface between bond pads and other structures in integrated circuits. The present invention further achieves efficient use of chip area by providing that at least a portion of each electrostatic discharge (ESD) device is positioned under a bond pad, improving device density.

2. Discussion of the Related Art

Integrated circuit devices are typically packaged. One of the principal functions of the package is to allow connection of the chip to a circuit board or other electronic product. Such connection can generally not be made directly from the chip to the target product due to the thin, fragile microscopic metal e us ed to interconnect the several components on the chip surface. Many metal leads are typically about 0.6 $\mu$ m thick and less than 1.0 $\mu$ m wide. Indeed, many of the surface features of current production integrated circuits are "submicron" or less than 1.0 $\mu$ m in width.

The wire currently available is typically in the range of 17 to 30 $\mu$ m in diameter, many times larger than the integrated circuit's surface wiring. This difference in the size of these two wing structures is one of the reasons that Chip source wiring usually terminates at bond pads disposed on the chip, typically arrayed about the periphery of the chip as a pitch transformer. Traditionally, of course, bond pads have been restricted to the chip periphery to avoid wire crossings. After the chip including the bond pads is formed, fine wiring in the form of bond or lead wire typically connects the bond pads to the substantial lead system (a.k.a. lead flame) that connects the package chip to the device in which is installed. One common bond pad material is aluminum, deposited dug chip fabrication. Bond wires are often gold or aluminum and are typically connected to the bond pads by means of metal balls or wedge bonds formed at the end of the bond wires and applied to the bond pad. Bond wires may be attached by thermosonic bonding, or other wire attachment methodology well known to those of ordinary skill in the art.

The first problem, which occurs in some integrated circuit devices, is cratering in the layers under the bond pads, generally fracture of the silicon and dielectric oxide layers. This phenomenon is sometimes referred to as "bond pad cratering". While studies to determine exact meachanisms for crater initiation and propagation are still underway, an overview of some of the known mechanics of crater formation is discussed as follows.

One process, which has been shown to be cotributory to crater initiation, is the use of thermosonic attachment methodology for attaching bond wires to bond pads. Thermosonic bonding employs ultrasonic vibration, typically about 60–120 kHz, to form the bond. This dynamic is shown in FIG. 1. Having reference to that Figure, there is shown a cross-section through an integrated circuit (IC) device 1, the device formed of a plurality of layers and including at least one bond pad 2. In this example, the layers of the device 1 include silicon substrate 4, field oxide layer 6, BPSG layer 8, passivation layer 9, and plastic encapsulant 10. A wire bond is shown at 12, including ball 14. Noted in this Figure, the center of the die is located toward the direction labeled "Z". This listing of layers in the device is not meant to be exhaustive, but is rather illustrative of some of the several layers of a micro-electronic device known in the art.

During the wire bonding process, wire bond ball 14 is attached to bond pad 2 utilizing, for example, thermosonic bonding. The bonding process can induce microcracks, for example as shown at 20. With repeated thermal cycling, these microcracks can propagate, for instance as shown at 24, in the layers beneath the bond pad, causing chip failure. Some of these mechanisms are described below.

FIGS. 2A, 2B, and 2C are plan views of a section of a microdevice directly beneath a bond pad, following chemical removal of the bond wire ball, and demonstrating microcrack initiation and propagation. FIGS. 2A', 2B', and 2C' are cross-sections through the same section, however with the bond pads and bond wires intact.

Having reference now to FIG. 2, the physical propagation of a microcrack into a full-blown pad crater is shown. At FIGS. 2A and 2A' a microcrack 20 has been formed in a layer immediately beneath bond at 2. With repeated the thermal cycling, this microcrack propagates in the direction shown at 26 in FIGS. 2B and 2B'. With continued thermal cycling, crack propagation moves in a generally elliptical manner (FIG. 2B), and downward (FIG. 2B'). It should be noted that this elliptical crater (FIG. 2B') is formed with its short axis aligned along a line originating substantially near the chip center.

At FIG. 3 is shown a scanning electron microscope (SEM) image of two areas underlying bond pads of a device 1, which failed due to bond pad cratering. This generally elliptical crater formation, and its alignment with the center of the device, as previously discussed, is clearly shown in these photomicrographs. Cratering induces a subtle and insidious reliability problem which integrated circuit devices: the craters so formed generally preclude reliable electrical contact between the chip's surface wiring and the bond pads, and hence with any device to which the package integrated circuit is electrically connected.

Moreover, this contact failure is often intermittent, rendering the chip unreliable and the defect difficult to detect.

Finally, the formation of craters is a progressive process. This means that while a pre-disposition for crater formation, in the form of the previously discussed microcracks, and attendant chip failure may be present when the chip is going through the chip test procedures during manufacturing the crater may not yet actually have formed This pre-disposition is referred to herein as "crater jeopardy". It is only after a substantial number of thermal cycles that the crater forms, and attendant chip failure occurs.

It will be understood by those having skill in the art that the bond pad cratering phenomena previously ed are still under investigation. While it is generally believed that microcracks are initiated by stresses induced by the dynamic force of the gold ball at touch-down impact, the static force applied after touch-down, the level of ultrasonic energy, mechanical vibrations before or after bonding, and/or the hardness of the gold ball and the pad, the role which each of these mechanisms plays in crack/crater formation is still under investigation. Moreover, while the formation of cracks is believed to be dependent on the bonding mechanism, bond parameters, the thickness of the wire bond pad, and characteristics of the wire bond material being bonded, the roles of each of these mechanisms is also under investigation. Furthermore, continued research has shown that thermal cycling and shock during the plastic encapsulation process may play a role in propagating bond pad crater formation.

While a number of mechanisms and procedures are currently being investigated to prevent bond pad crater formation and attendant chip failure, given the insidious nature of the onset of crater formation, what is especially important is a practical methodology to detect microcracks under the bond pads during the manufacturing process. The methodologies previously utilized to detect bond pad crack/crater formation are insufficient as being laborious and destructive as will now be described A first prior art methodology for monitoring crater jeopardy is by destructive decapitation and deprocessing, including the chemical removal of the ball bonds, followed by visual inspection and high magnification. The results of one such SEM examination of the area under two bond pads sufferin from bond pad crater formation is shown in FIG. 3. It will be appreciated that while this monitoring for crater jeopardy is particularly effective, it is the both laborious and destructive, rendering the device inoperative and unfit for further service. Clearly, this destructive and labor-intensive process cannot be effective for shippable products.

The second prior art methodology has been to undertake one or more functional tests of the chip subsequent to encapsulation. As previously discussed, one of the factors known to be important in bond pad crater formation is thermal cycling. Accordingly, it will be appreciated that it may require hundreds or even thousands of device heat/cool cycles before microcracks develop into full-blown bond pad craters, with an attendant bond pad failure sufficient to trigger a functional test. Accordingly, this methodology has not proven particularly effective. Moreover, utilization of this test methodology has been shown to reduce the life expectancy of the device.

Finally, there exist special test structures for electrical detection of the problem. These usually include continuity tests, or test for electrical leakage by structures under the pad. While these test structures have in some cases been shown to be effective for the detection of larger cracks and bond pad craters, they are not the optimal solution to the problem. In the first place, the use of these test structures introduces one or more additional processes during manufacturing. Secondly, the accuracy and reliability of these test structures for detecting the microcracks shortly their inception has not been proven.

Another problem relates to the inclusion of on-chip electrostatic discharge (ESD) devices. Typically, an ESD device 40 is connected between a bond pad 42 and a device 44 to be protected (FIG. 4), the bond pad 42 being connected to pin 45. The ESD device 40 includes a diffused or deposited resistor 46 connected between the pad 42 and the device 44 to be protected, resistor 46 acting as a diode 48 connected to Vss, and a pair of large NMOS transistors 52, 54 connected to the conductor 51 between the resistor 46 and pad 42. In normal operation of the ESD device 40, transistors 52, 54 are connected to voltage source Vdd and voltage source Vss, and diode 48 is connected to voltage source Vss, as shown. Another, smaller NMOS transistor 56 is connected to the gates of transistors 52, 54 and to voltage source Vss. The NMOS field transistor 56 has its gate connected to voltage source Vdd. The transistors 52, 54, 56, resistor 46 and diode 48 are typically laid out on the chip beside the associated die pad 42.

It will be seen that in particular the two large transistors 52, 54 occupy a large amount of chip area. It will be understood that improvement in device density on the chip is continually being sought, in order to improve operating performance and manufacturing efficiency.

Therefore, what is needed is a method to detect the formation of microcracks in the substrate immediately below the bond pad or bond pads of a micro-device. The methodology should enable the testing of each device during the manufacturing process without resorting to destructive test techniques. Moreover, the methodology should be capable of being implemented without unduly complicating or lengthening the normal manufacturing process for such devices. The methodology should not require additional bond pads or pins in the semiconductor device.

What is further needed is a way to improve chip density, in particular by laying out the ESD device and bond pad in a manner which provides that the resulting structure occupies less chip area than previous designs.

An especially elegant solution to these problems would be a single solution capable of simultaneously addressing and solving these two disparate issues.

SUMMARY OF THE INVENTION

The present invention teaches a methodology whereby 100 percent of the pads on chips undergoing manufacture can be effectively tested for the formation of cracks, most importantly small cracks, beneath the wire bond pad The methodology is non-descriptive in nature, and does not overly complicate the manufacturing process. The methodology uses a portion of an electrostatic discharge (ESD) device associated with the pad in such testing, with at least a portion of the ESD device positioned under the pad so that chip area is used effectively.

The transistors of an ESD device are positioned generally side-by-side beneath a bond pad. A diagnostic voltage is applied to a transistor and current there through is measured by an ammeter. In the event that all gates of the transistor are intact, current will be measured, as determined by the intact state of the gates. The intact state of the gates indicates that little or no cracking/cratering has occurred in the device beneath this transistor. In the event that such cracking/cratering has occurred beneath the transistor, this will cause agate of the transistor to fracture, resulting in less current flowing through the transistor than if all gates were intact. This lower current can readily be noted by observation of the ammeter, indicating cracking/cratering beneath that area of the transistor. The other transistor beneath the bond pad is used in a like manner to test for cracks/craters there beneath.

By positioning a portion of the ESD device under a pad, a significant amount of chip area is saved, contributing significantly to chip density. Moreover, the testing step used to implement the methodology is not particularly time consuming, thereby aiding in economy of manufacture.

The present invention is better understood upon consideration of the detailed description below, in conjunction with the accompanying drawings. As will become readily apparent to those skilled in the art from the following description, there is shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
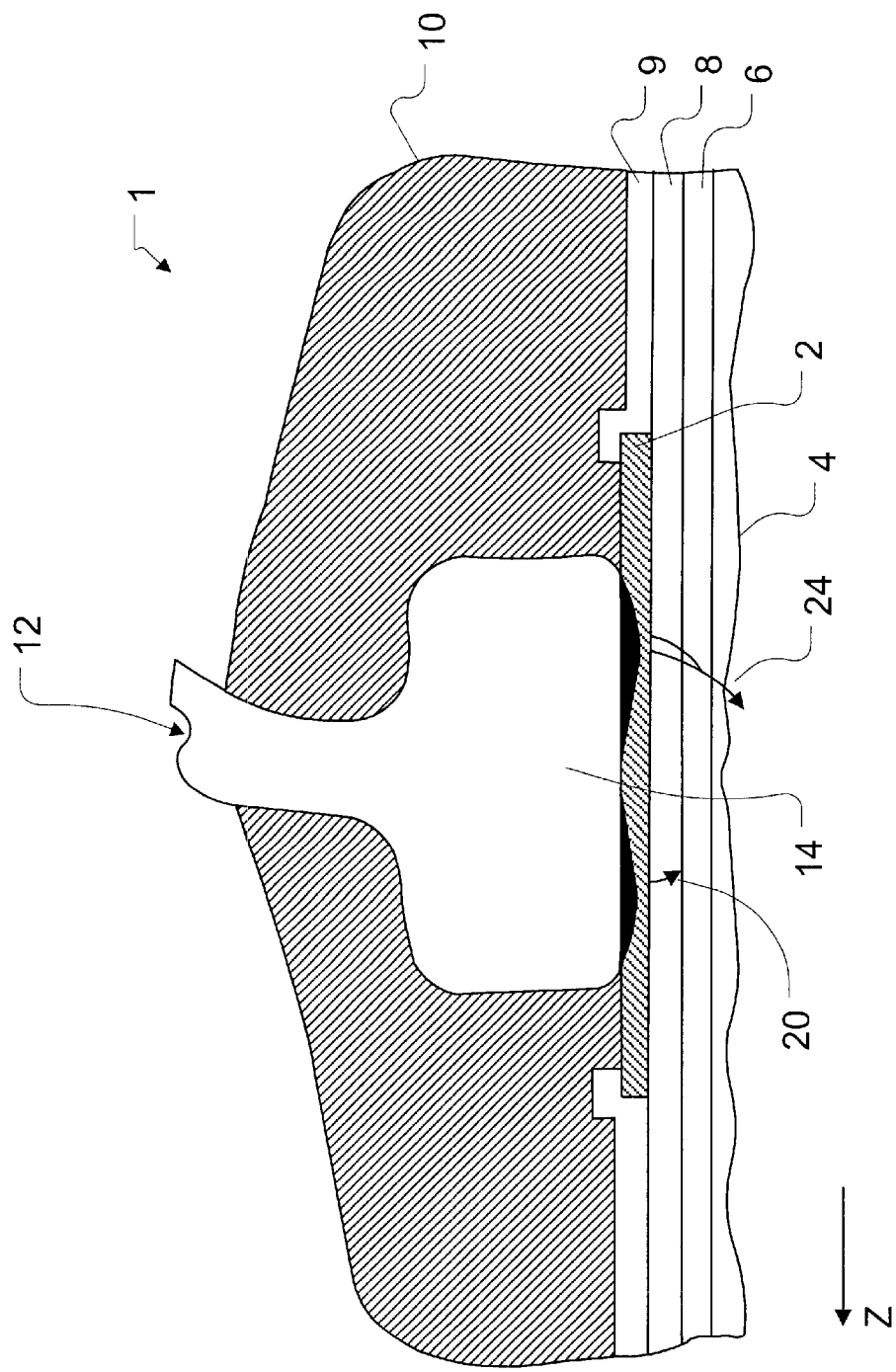
FIG. 1 is a cross sectional view taken through the wire bond pad of a micro electronic device demonstrating crater jeopardy beneath the pad.
Figure 2:
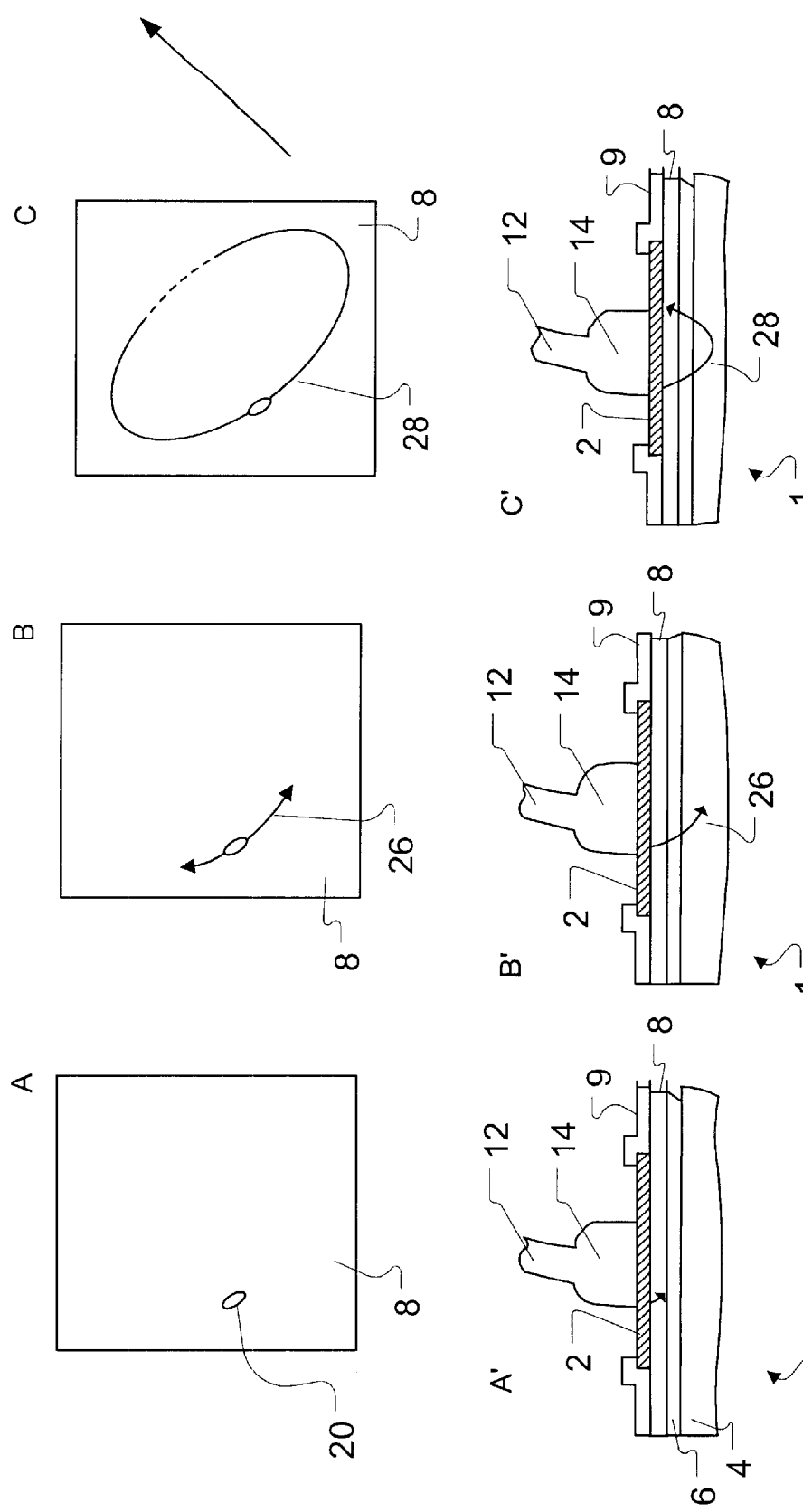
FIG. 2 is a cross sectional view taken through the wire bond pad of a micro-electronic device showing the progression of wire bond pad crater formation.
Figure 3:
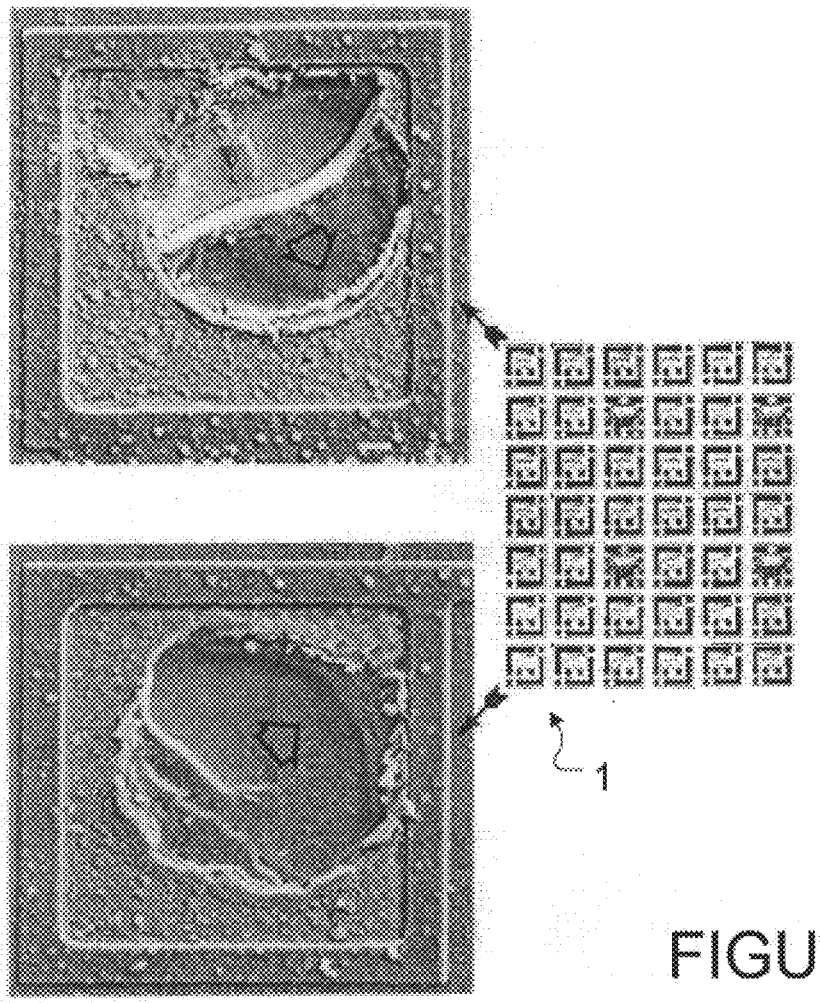
FIG. 3 is a photomicrograph of the areas beneath bond pads having suffered bond pad crater failure.
Figure 4:
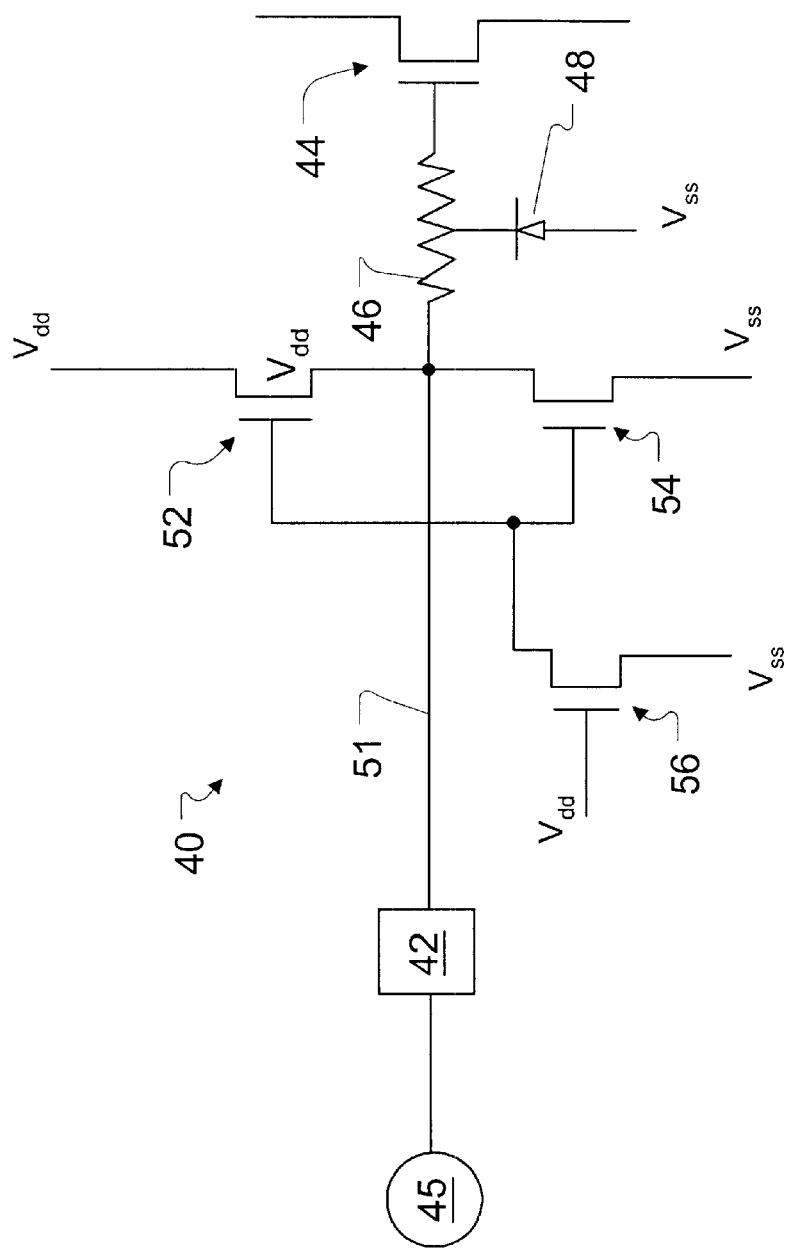
FIG. 4 is a schematic diagram of an ESD device associated with a semiconductor device.
Figure 5A:
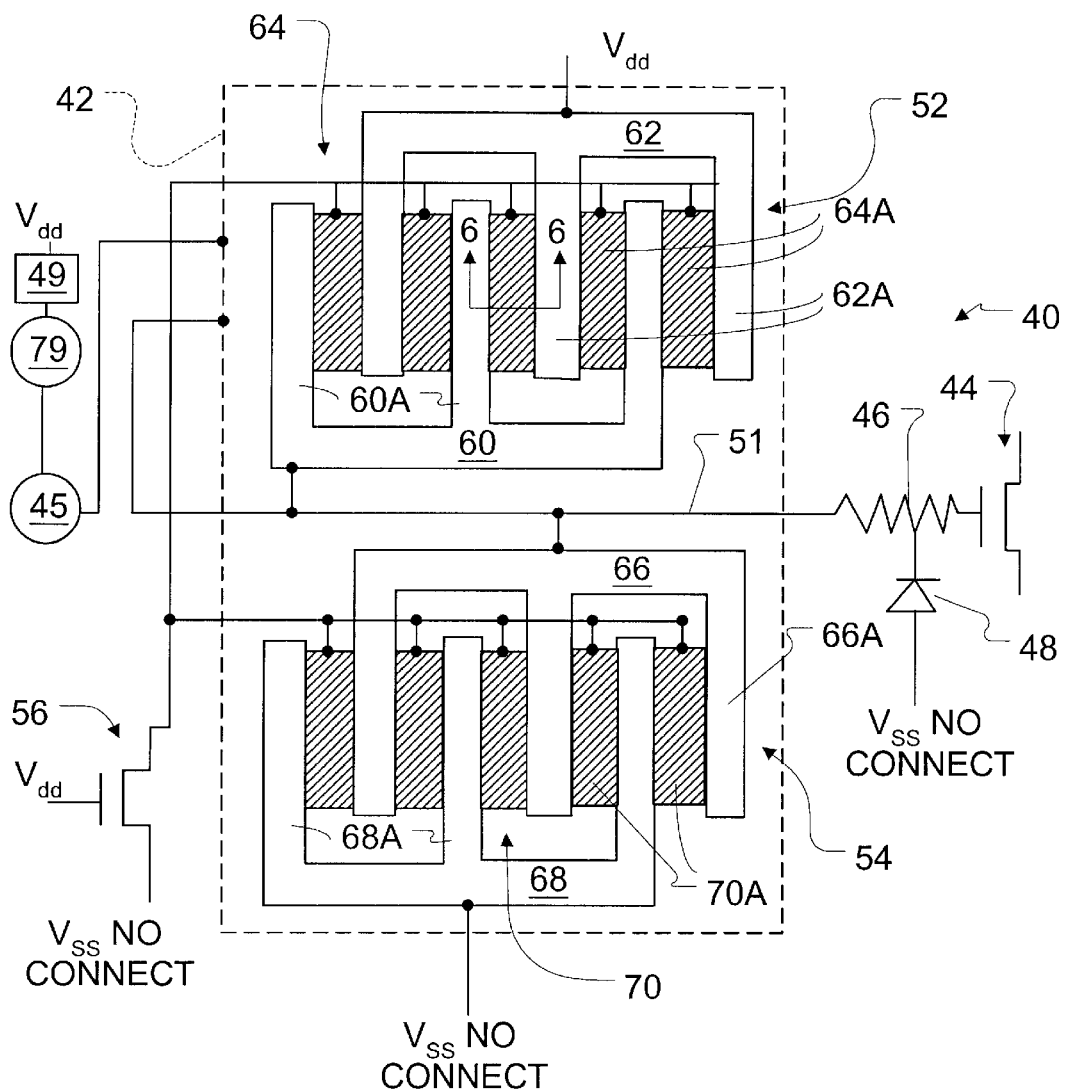
FIG. 5A is a circuit diagram of the present invention, operatively associated with one bond pad, and showing a testing step.
Figure 5B:
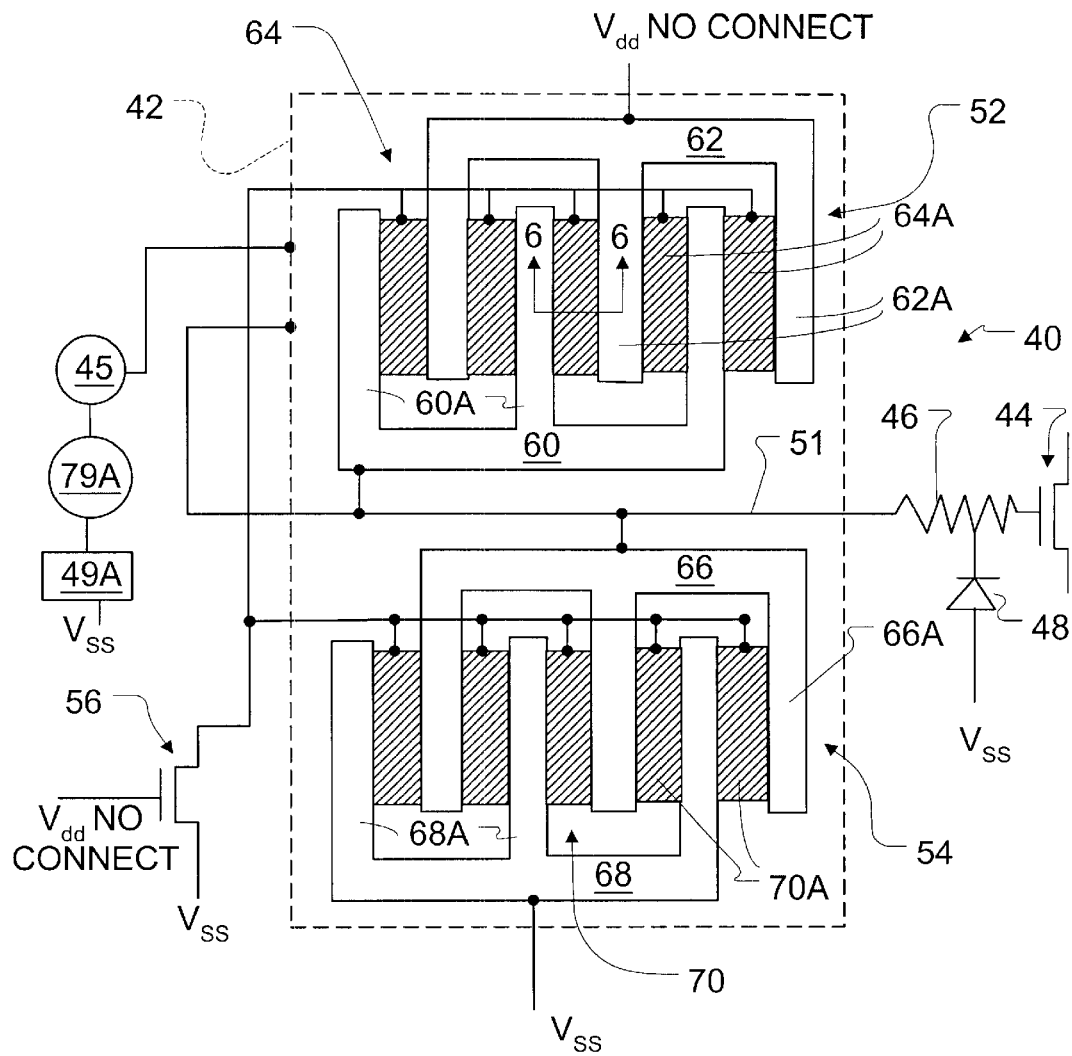
FIG. 5B is a circuit diagram of the present invention, operatively associated with one bond pad, and showing a further testing step.
Figure 6:
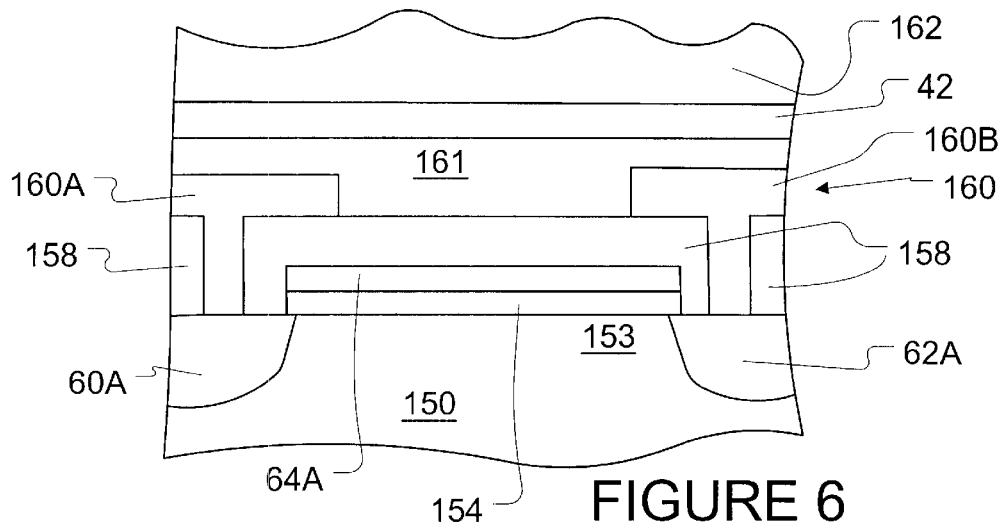
FIG. 6 is a sectional view taken along the line 6—6 of FIG. 5A.

Having reference to FIGS. 5A, 5B and 6, the structure and function of the present invention are explained. FIGS. 5A and 5B are circuit diagrams illustrating a circuit similar to that shown in FIG. 4, but laid out in accordance with the present invention. As shown therein, a pin 45 is connected to a bond pad 42, and an ESD device 40 is connected between the bond pad 42 and the device 44 to be protected. The ESD device 40 includes a diffused resistor 46 connected to bond pad 42 and the device 44 by conductor 51. Diode 48 is the parasitic portion of resistor to substrate when connected to Vss. The large transistors 52, 54 are located beneath the bond pad 42. The source 60 and drain 62 of transistor 52 include interleaved source and drain regions 60A, 62A, and a gate structure 64 made up of polysilicon gates 64A, each of which is operatively associated with adjacent source and drain regions, as is well-known. The transistor 52 has its source 60 connected to the conductor 51 between the resistor 46 and bond pad 42. The transistor 54 has its drain 66 connected to the conductor 51 between the resistor 46 and bond pad 42. The source 68 and drain 66 of the transistor 54 also include interleaved source and drain regions 68A, 66A, and gate structure 70 is made up of polysilicon gates 70A, each of which is operatively associated with adjacent source and drain regions, similar to the above. Transistor 56 is connected to the gate structures 64, 70 of the transistors 52, 54. As described with reference to FIG. 4, during normal operation of the ESD device 40, the drain of transistor 56 would be low, forcing both transistors 52 and 54 to be nonconductive. If Vdd were not present or pin 45 were driven very positive or very negative by an ESD transient, then transistors 52 and/or 54 would change state to conductive.

With reference to FIG. 6, a detailed sectional view of the device of FIGS. 5A and 5B is shown. The device includes a silicon layer 150 having source and drain regions 60A, 62A therein, separated by a channel region 153. A gate oxide 154 is provided over the channel region 153, and a polysilicon gate 64A overlies the gate oxide 154. A BPSG layer 158 overlies the silicon layer 150, and a metal layer 160 is provided over the BPSG layer 158. The BPSG layer 158 defines openings for vias which connect the source region 60A and drain region 62A with portions 160A, 160B of the metal layer 160. Provided over the metal layer 160 is an ILD layer 161, on top of which is provided bond pad 42. The bond pad 42 has fixed thereto the ball 162 of a wire bond.

Polysilicon gate 64A is preferably formed closely beneath bond pad 42, although in some embodiments, it may prove advantageous to position the gate 64A in another, lower layer closer to silicon.

During diagnostic, but not normal device use (FIG. 5A), ammeter 49 and negative voltage source 79 would be connected in series to Vdd, while Vss would be a No Connect. Vdd is also applied to the drain 62 of transistor 52 and the gate of field transistor 56. Since Vdd is not biased relative to Vss (floating), the field transistor 56 would be non-conductive, putting transistor 52 in the conductive state. Thus, the current would be driven by voltage source 79 around the loop, through ammeter 49, and through the channel regions 153 of transistor 52, completing the loop to Vdd.

Figure 8:
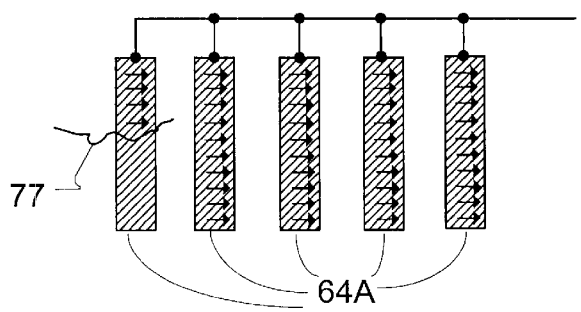
FIG. 8 is a view similar to that shown in FIG. 7, but showing a fracture in one of the gates.

In the event a crack forms beneath bond pad 42 and transistor 52, such crack 77 would propagate upward through a gate 64A of transistor 52 (FIG. 8), severing it and reducing current flow through the transistor 52, as shown by the arrows indicating current flow in such FIG. 8. Thus, reduced current flows through the transistor 52 and described path through the ammeter 49, which reduced current would be indicated by the ammeter 49. It will be seen that the area beneath the transistor 52 can be readily tested for cracks/craters thereunder.

During further diagnostic, but not normal device use (FIG. 5B), ammeter 49A and positive voltage source 79A would be connected in series to voltage source Vss, and voltage source Vss would be connected to the field transistor 56, source 68 and diode 48, while Vdd would be a No Connect. Since Vss is not biased relative to Vdd (floating), the field transistor 56 would be non-conductive, putting transistor 54 in a conductive state. Thus, a current would be driven by voltage source 79A around the loop, through ammeter 49A, and through the channel regions of transistor 52, completing the loop to Vss.

In the event a crack forms beneath bond pad 42 and transistor 54, such crack 77 would propagate upward through a gate 70A of transistor 54 (FIG. 8), severing it and reducing current flow through the transistor 54, as shown by the arrows indicating current flow in such FIG. 8. Thus, reduced current flows through the transistor 54 and described path through the ammeter 49A, which reduced current would be indicated by the ammeter 49A. It will be seen that the area under the transistor 54 can be readily tested for cracks/craters thereunder.

Figure 7:
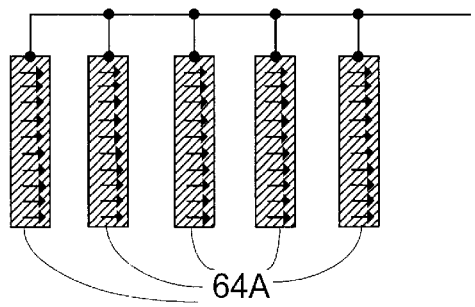
FIG. 7 is a plan view of the gates of one transistor of the ESD device, showing the gates intact.
Figure 9:
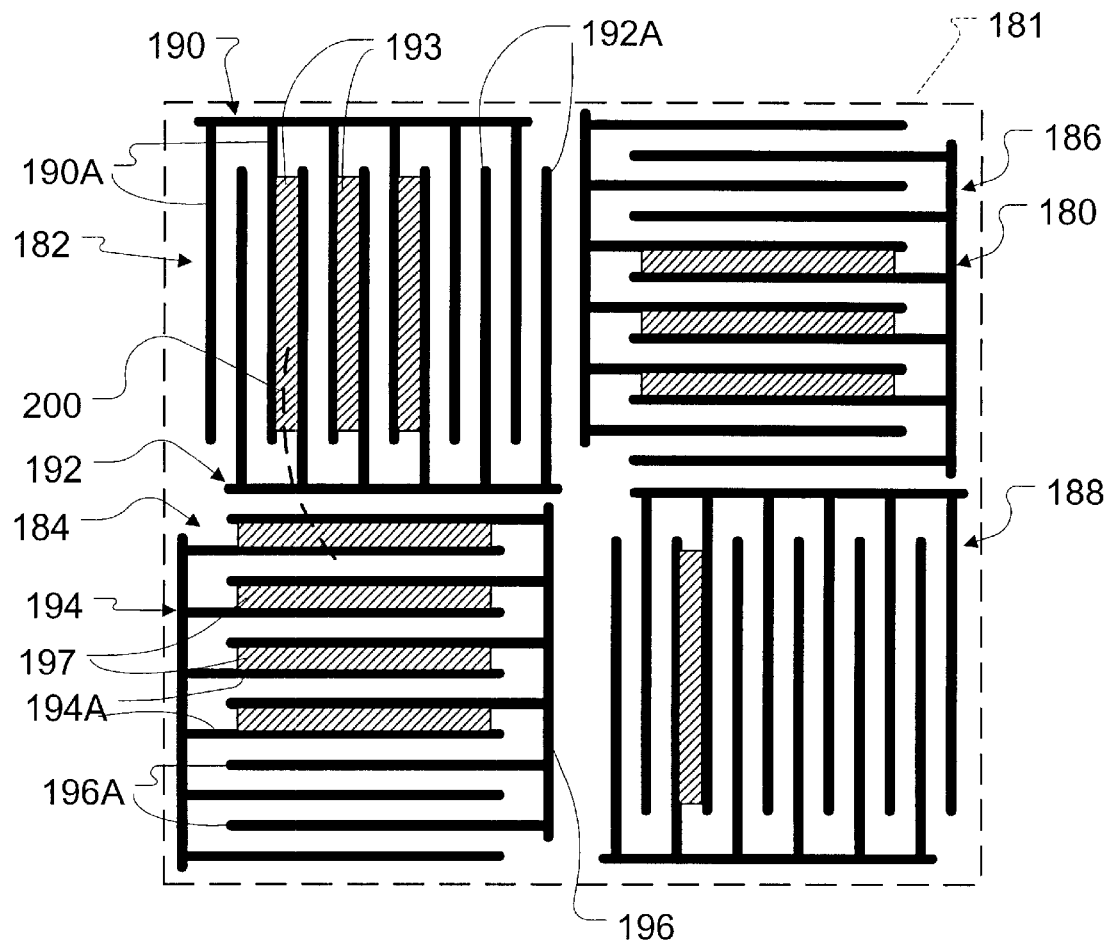
FIG. 9 is a simplified plan view of portions of another embodiment of transistor associated with a bond pad.
Figure 10:
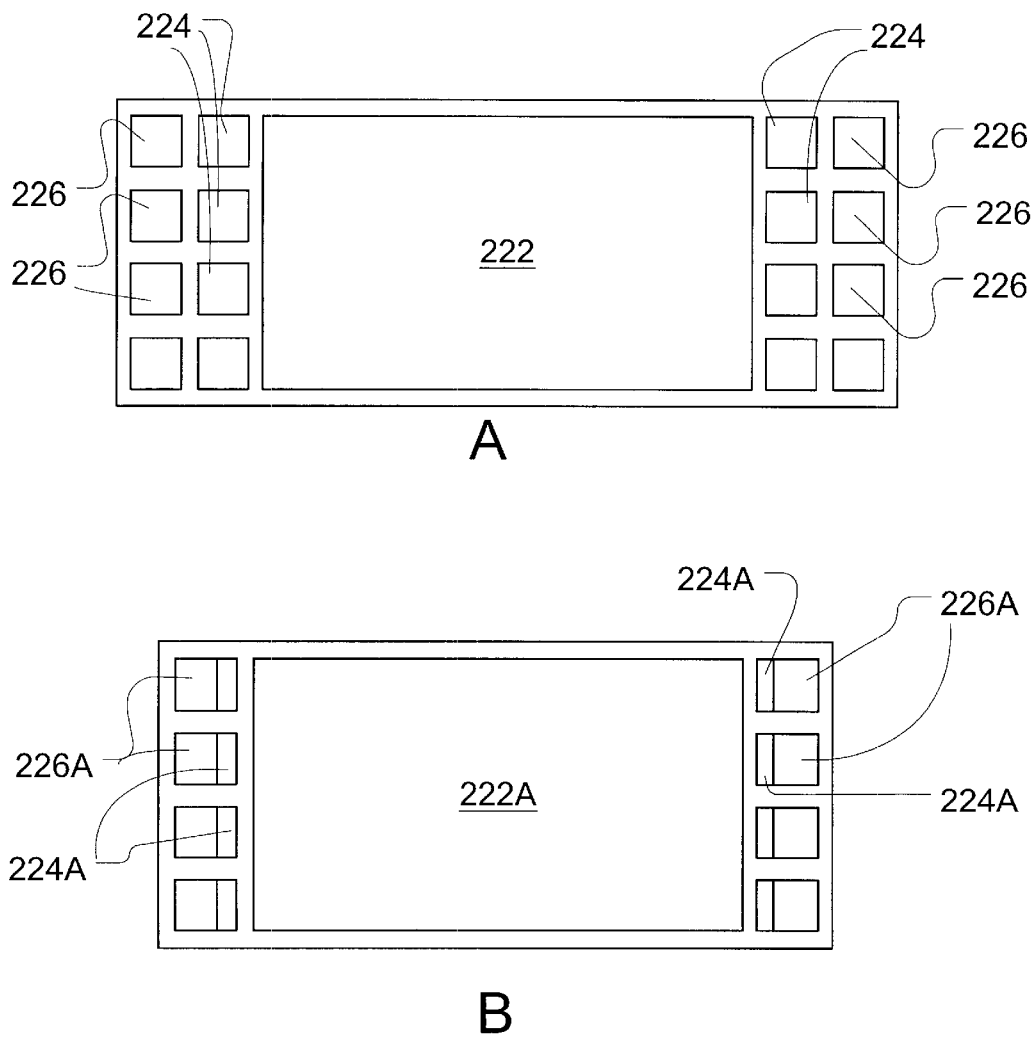
FIG. 10 is a plan view of general representations of a prior art chip and a chip incorporating the present invention, illustrating the decreased chip size of the latter.

FIG. 9 illustrates a second embodiment of large transistor 180 of the ESD device 40 for positioning under a bond pad 181. In this embodiment, the transistor 180 includes portions 182, 184, 186, 188. The transistor portion 182 has source 190 and drain 192, which have respective elongated interleaved source and drain regions 190A, 192A. Each pair of source/drain regions 190A, 190B has operatively associated therewith an elongated polysilicon gate 193. Similarly, the transistor portion 184 has source 194 and drain 196, which have respective interleaved source and drain regions 194A and 196A. Each pair of source/drain regions 194A and 196A has operatively associated therewith an elongated polysilicon gate 197. It will be seen that the longitudinal axes of the gates 193 of portion 180 are parallel to each other, and the longitudinal axes of the gates 197 of portion 182 are parallel to each other and perpendicular to the longitudinal axes of the gates 193. The transistor portion 186 is laid out in a manner similar to transistor portion 184, and transistor portion 188 is laid out in a manner similar to transistor portion 182. Comparing this configuration of transistor 180 with the transistor 52 previously described, in the previously described transistor 52 a crack in a gate 64A (due to cracking in layers below the transistor 52) could occur generally along the longitudinal axis of that gate 64A (also perpendicular to the section line 6—6 of FIG. 5). A gate crack of this type might not be sufficient to provide a significant drop in current through the transistor 52 during the test procedure described above. However, with the embodiment shown in FIG. 7, if a crack 200 starts in a gate 193 along a longitudinal axis of a gate 193, further spreading of that crack in the same general direction will cause the crack 200 to traverse additional gates 197 of the portion 184, which are positioned perpendicular to the gates 193, resulting in fracture of such gates 197 and corresponding drop in current through the transistor 180 during the test procedure. Thus, the positioning of the gates 193, 197 in this manner results in further advantage. It will be understood that portions of a transistor may be laid out in a wide variety of ways in furtherance of this invention FIG. 10A shows a layout of a prior art chip 220, which includes an active device region 222, ESD devices 224 positioned about the outer periphery of the active device region 222, and bond pads 226 located outward of the ESD devices 224. By positioning at least some of each ESD device 224A under a bond pad in 226A accordance with the present invention (FIG. 10B), it will be seen higher device density and smaller chip size are achieved.

While a pair of transistors of an ESD device have been shown under a bond pad in furtherance of achieving the each objects of the invention, it will be understood that more or less of the ESD device may be positioned under an associated bond pad as appropriate. For example, both transistors, a single transistor, or a portion of a transistor, may under appropriate circumstances be positioned under a bond pad It will also be noted that while the transistor gates are described as of polysilicon, any suitable brittle material may be used in furtherance of the invention.

It will be appreciated that the term "pin" as used herein comprehends not only traditional wire-to-semiconductor connections, but also solder bumps, flip chip attachment points, and substantially all other electrical contact methodologies for electrically connecting an internal bond pad with an external electrical connection (pin) which are known to those of ordinary skill in the semiconductor arts.

The foregoing description of the embodiment of the invention has been presented for purposes of illustration and description. It is not intended to be exhaustive or to limit the invention to the precise form disclosed. Other modifications or variations are possible in light of the above teachings. The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. For a semiconductor device including a chip having at least one layer formed on a substrate, and a plurality of wire bond pads electrically connected with a corresponding plurality of external electrical contacts, a non-destructive method of testing for the formation of a crack in a portion of the chip beneath selected ones of the plurality of bond pads, the method comprising the steps of:
   disposing at least a portion of a gate of the transistor beneath the bond pad;
   applying a current to the transistor; and
   determining the presence of a crack in at least one layer of the semiconductor chip beneath the bond pad by measuring current through the transistor.

2. The method of claim 1 and further comprising the step of providing that the transistor is part of an electrostatic discharge device.

3. The method of claim 2 and further comprising the step of providing that at least a portion of each of a plurality of gates of the transistor is disposed beneath the bond pad.

4. A semiconductor device for implementing a non-destructive method of testing for the formation of a crack in a portion of a semiconductor chip beneath a bond pad, the semiconductor device comprising a gate of a transistor, at least a portion of the gate being disposed beneath the bond pad.

5. The semiconductor device of claim 4 wherein the transistor is part of an electrostatic discharge device.

6. The semiconductor device of claim 5 and further comprising a plurality of gates of the transistor, at least a portion of each of the gates being disposed beneath the bond pad.

7. The semiconductor device of claim 6 wherein each gate is elongated in configuration, and wherein the longitudinal axis of least one gate is non-parallel to the longitudinal axis of least one other gate.

8. The semiconductor device of claim 7 wherein the longitudinal axis of at least one gate is substantially perpendicular to the longitudinal axis of at least one other gate.

9. The semiconductor device of claim 3 wherein each gate of a first group of the plurality of gates is elongated in configuration, with the longitudinal axes of the gates of the first group of gates being substantially parallel to each other, and wherein each gate of a second group of the plurality of gates is elongated in configuration, with the longitudinal axes of the gates of the second group of gates being substantially parallel to each other, and wherein the longitudinal axes of the gates of the first group of the plurality of gates are substantially perpendicular to the longitudinal axes of the gates of the second group of gates.

* * * * *

UNITED STATES PATENT AND TRADEMARK OFFICE
CERTIFICATE OF CORRECTION

PATENT NO. : 6,395,568 B1
DATED : May 28, 2002
INVENTOR(S) : Richard C. Blish, Colin D. Hatchard, Ian Morgan and Michael Fliesler It is certified that error appears in the above-identified patent and that said Letters Patent is hereby corrected as shown below:

<u>Title page, Item [54] and Column 1, line 5,</u>
Title, "ESD PROTECTIONINTEGRATED CIRCUIT PRODUCTS" should read
-- ESD PROTECTIONIN INTEGRATED CIRCUIT PRODUCTS --.

<u>Column 8,</u>
Line 53, "3" should read -- 6 --.

Signed and Sealed this

Twenty-fourth Day of September, 2002

Attest:

Attesting Officer

JAMES E. ROGAN
*Director of the United States Patent and Trademark Office*